United States Patent [19]

D'Angelo et al.

[11] Patent Number: 4,523,147

[45] Date of Patent: Jun. 11, 1985

[54] FINE BALANCING SECOND DERIVATIVE GRADIOMETER

[75] Inventors: Silvano D'Angelo, Rome; Ivo Modena, Grottaferrata; Gian L. Romani, Rome, all of Italy

[73] Assignee: Consiglio Nazionale Delle Ricerche, Rome, Italy

[21] Appl. No.: 402,679

[22] Filed: Jul. 28, 1982

[30] Foreign Application Priority Data

Jul. 31, 1981 [IT] Italy .................. 49023 A/81

[51] Int. Cl.³ .................................. G01R 33/02
[52] U.S. Cl. ............................ 324/248; 324/244; 324/256; 324/257; 324/259
[58] Field of Search ............. 324/248, 257, 259, 245, 324/246, 237, 238, 253, 326, 247, 201, 226, 227, 228, 346, 244, 256; 336/119, 129, 132, 131

[56] References Cited

U.S. PATENT DOCUMENTS

| | | | |
|---|---|---|---|
| 2,445,979 | 7/1948 | Thompson | 336/129 |
| 2,475,829 | 7/1949 | Fennema | 336/129 |
| 2,574,229 | 11/1951 | Schlesinger | 336/129 |
| 3,262,309 | 7/1966 | Anderson | 336/129 |
| 3,428,929 | 2/1969 | Brown et al. | 336/129 |
| 3,753,096 | 8/1973 | Wiers | 324/233 |
| 3,848,183 | 11/1974 | Puidak | 336/129 |
| 3,956,690 | 5/1976 | Rorden | 324/248 X |
| 3,962,628 | 6/1976 | Rein | 324/248 |
| 3,965,411 | 6/1976 | Hesterman | 324/248 X |
| 3,976,938 | 8/1976 | Hesterman | 324/248 |
| 3,980,076 | 9/1976 | Wikswo, Jr. et al. | 324/248 X |

OTHER PUBLICATIONS

Barbanera, "A Gradiometer for the Study of Magnetic Fields Generated by the Human Heart in a Magnetically Unshielded Environment Preliminary Results", vol. 11, No. 4, Apr. 1978, pp. 297–298, J. Phys. E. Sci. Intrum.

Nave et al., "Micromagnetic Susceptometer", Rev. Sci. Instrum., vol. 51, No. 5, May 1980, pp. 591–596.

Primary Examiner—Gerard R. Strecker
Assistant Examiner—Warren S. Edmonds
Attorney, Agent, or Firm—Pollock, Vande Sande & Priddy

[57] ABSTRACT

A fine balancing three-coil type gradiometer, comprising a support member for the coils which consists of two elements, the first of which bears the central coil and one of the end coils, while the second supports the other coil and is arranged to controllably cause the micrometric axial displacement of the element itself with respect to the other one, in order to vary the distance between the planes of the coils and to achieve the desired balancing.

3 Claims, 12 Drawing Figures

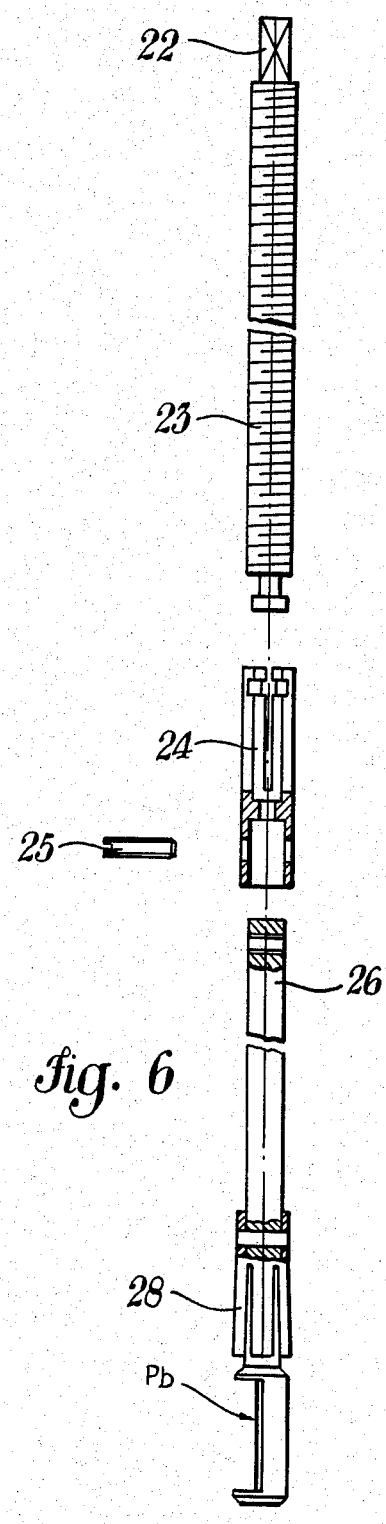
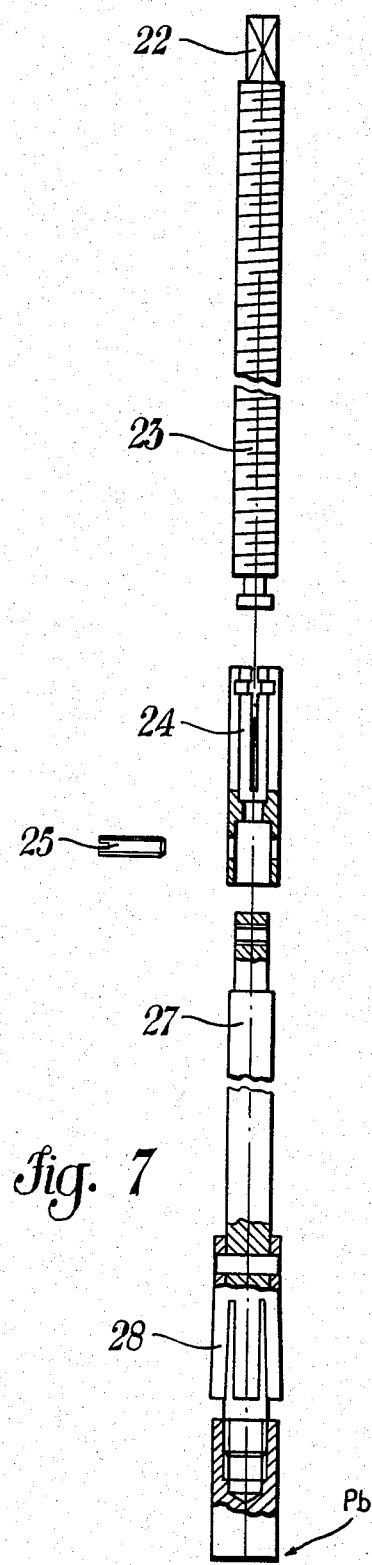
fig. 6
fig. 7

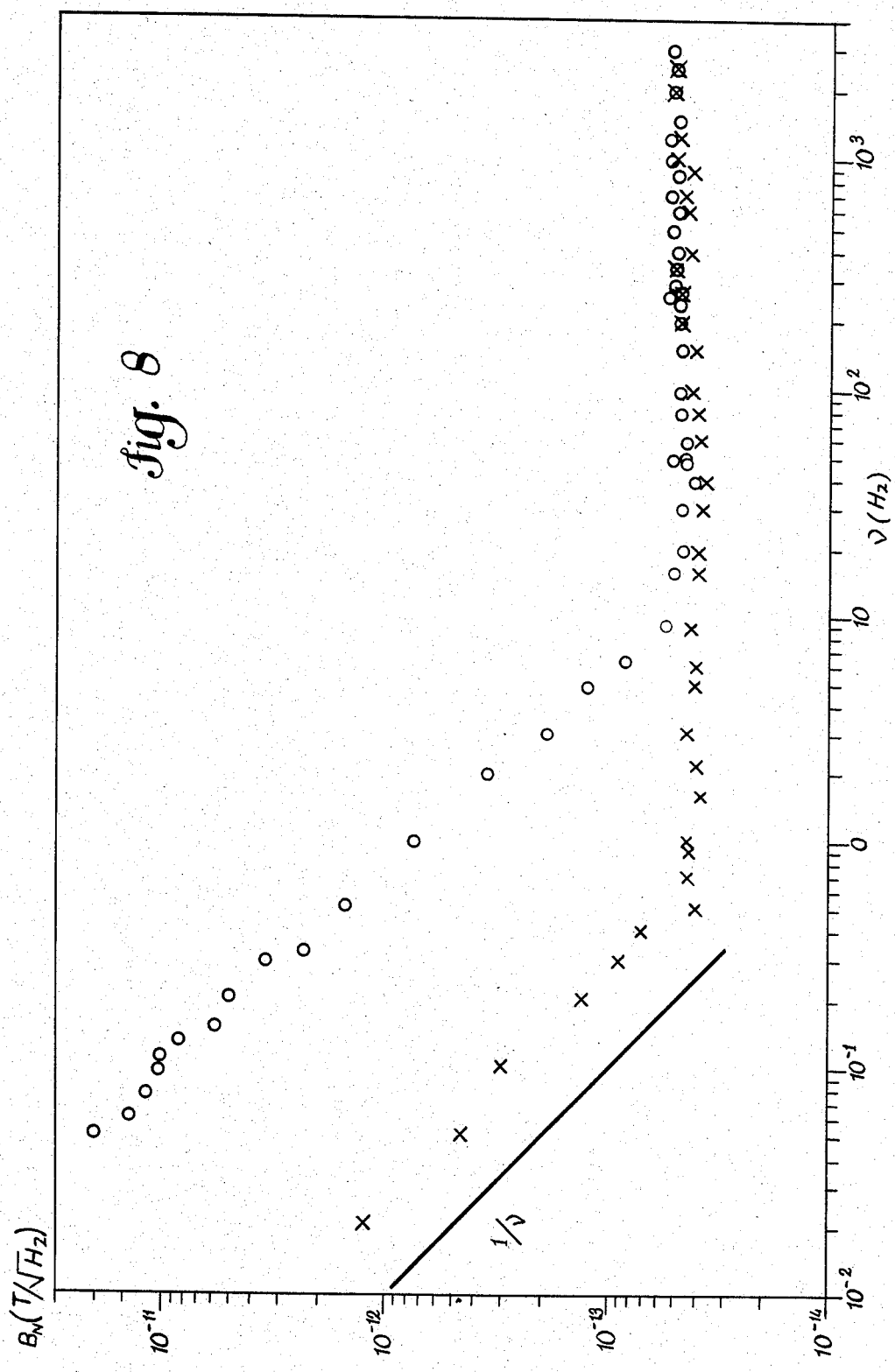

FINE BALANCING SECOND DERIVATIVE GRADIOMETER

FIELD OF THE INVENTION

This invention relates to the measurement of weak magnetic signals immersed in a background noise of much higher strength. More particularly, the invention relates to a device which enables the perfect balancing of a 2nd derivative gradiometer.

BACKGROUND OF THE INVENTION

In recent years, the measurement of magnetic signals generated by the physiological activity of various organs of the human body has gained increasing interest. Such measurements have been made possible by the development of superconducting instrumentation having sufficient sensitivity. The magnetic detector so utilized is a superconducting magnetometer or "SQUID". These detectors have an extremely high sensitivity of up to $10^{-4}$ Tesla/$\sqrt{}$—Hz in the frequency range D.C.+20 KHz. On the other hand, neuromagnetic fields are extremely weak from an amplitude of $10^{-12}$T, for the higher signals due to spontaneous activity, to an amplitude of less than $10^{-13}$ Tesla for the induced neuromagnetic signals. These values are many magnitude orders lower than both the earth magnetic field and than urban magnetic disturbances substantially due to the displacement of large ferromagnetic masses (elevators, machines, etc.) and than the magnetic fields generated by power mains.

Therefore, the problem is to measure extremely weak signals in environments in which the background magnetic noise is of many orders higher than the signals themselves.

To extract the signal to be measured from such high background noise, one can either operate in magnetically shielded environments, or perform a spatial rejection by means of a 2nd derivative gradiometer.

OBJECT OF THE INVENTION

It is an object of this invention to provide a device adapted to improve the rejection of constant gradient fields by using a three-coil type gradiometer.

According to the invention, a device is provided which enables compensation for the difference of the distances between the planes of the three coils by means of fine displacement (which can be effected from outside the cryostat) of one of the two end coils. To this effect, the coils are not wound in the usual manner upon a single support member, but their support member consists of two portions movable with respect to each other. The central coil and one of the end coils are wound upon a first portion, while the second portion bears the other coil and can be coaxially moved in a micrometric manner.

BRIEF DESCRIPTION OF THE DRAWINGS

The invention will be now described with reference to the attached drawings in which a preferred embodiment of the invention is shown for purposes of illustration, and in which

FIGS. 3A and 3B are cross-sectional views along planes A—A and B—B of FIG. 3;

FIG. 3C is a cross-sectional view along plane C—C of FIG. 3A;

FIG. 3D is a cross-sectional view along plane D—D of FIG. 3A;

FIG. 6 is a detail view of one of the compensation bars of axes x and y;

FIG. 7 is a detail view of the compensation bar of axis Z;

FIG. 8 is a comparative diagram between the output noise spectra of a traditional magnetomer and a magnetometer according to this invention.

DESCRIPTION OF THE PREFERRED EMBODIMENT

Figure 1:
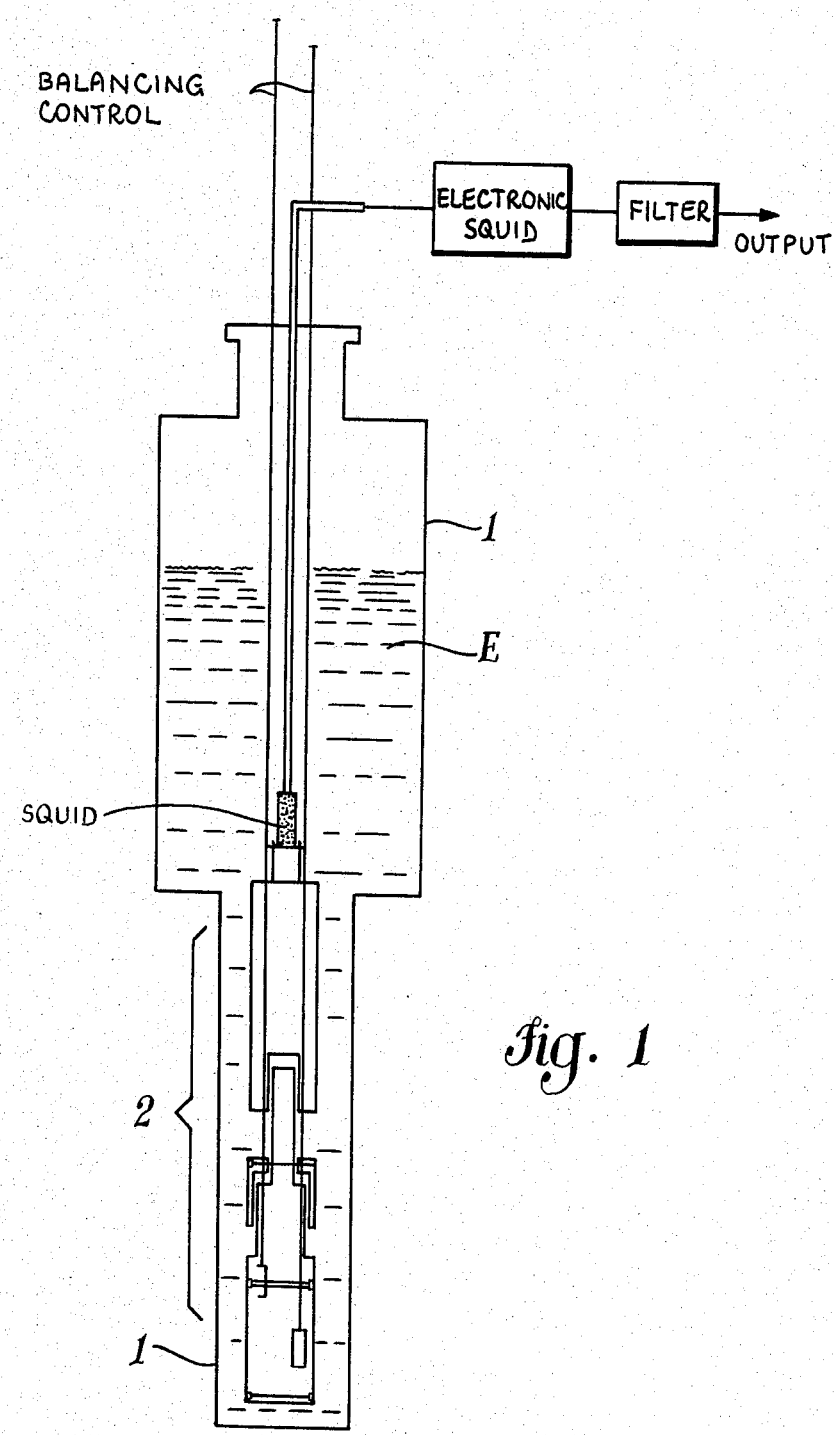
FIG. 1 is a schematic diagram of the instrumentation according to the invention.
Figure 2:
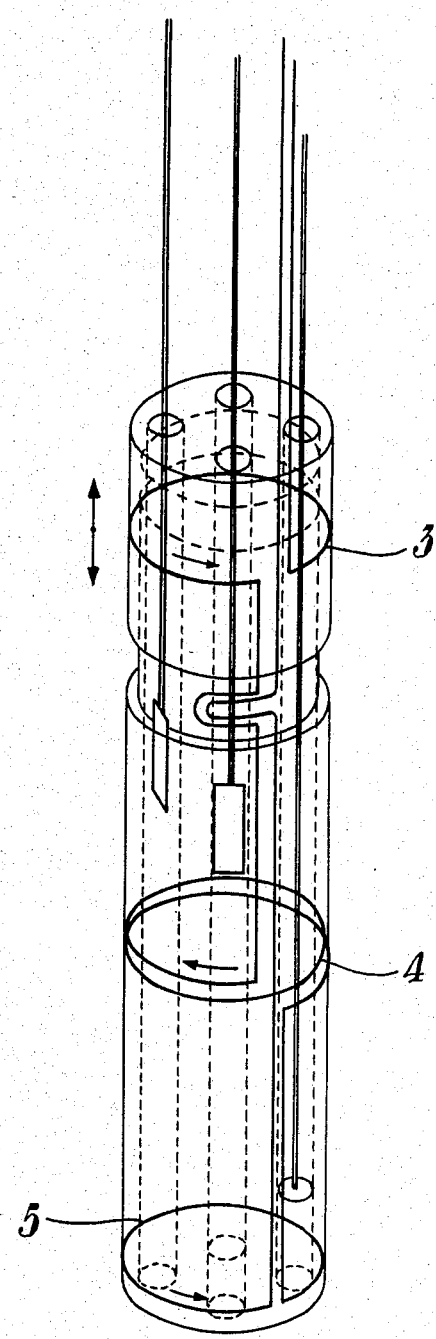
FIG. 2 is a perspective view of the balancing 2nd derivative gradiometer.

Referring to FIG. 1, the 2nd derivative gradiometer constitutes the primary winding of a magnetic flux transformer, the secondary winding of which is constituted by a coil for coupling to the superconductive magnetometer or "SQUID". This portion of the detector is wholly contained in a cryostat 1 and immersed in a bath of liquid Helium E at a temperature of 4.2° K. (−268.8° C.). The gradiometer 2 is comprised of three serially wound coils normally having the same surface areas and numbers of turns N, 2N and N, respectively, as shown in FIG. 2, wherein the coils are designated 3, 4 and 5. The three coils are placed on equally spaced planes, at a distance b between planes. The operation of the gradiometer is based upon the fact that the central coil 4 (2N turns) is wound inversely with respect to the two end coils 3 and 5 (each having N turns). Such a configuration is characterized in that, when placed in an external magnetic field, it has a total linked magnetic flux which is zero if the field is spatially constant or provided with a constant gradient. When such a condition is established, it can be stated that the gradiometer is perfectly balanced.

In effect, however, the linked flux is never strictly zero, due to the limits of the mechanical arrangement of the windings. Fine balancing systems of various kinds have been proposed, all aimed at achieving an optimal balancing only in respect of a constant magnetic field. The common basic principle of these systems consists in using small turns or plates of superconductive material, suitably positionable, with external control of the cryostat, among the planes of the coils. It is believed that no attempt has ever been made to improve the balancing of the gradiometer also in respect of the field gradient.

Figure 3:
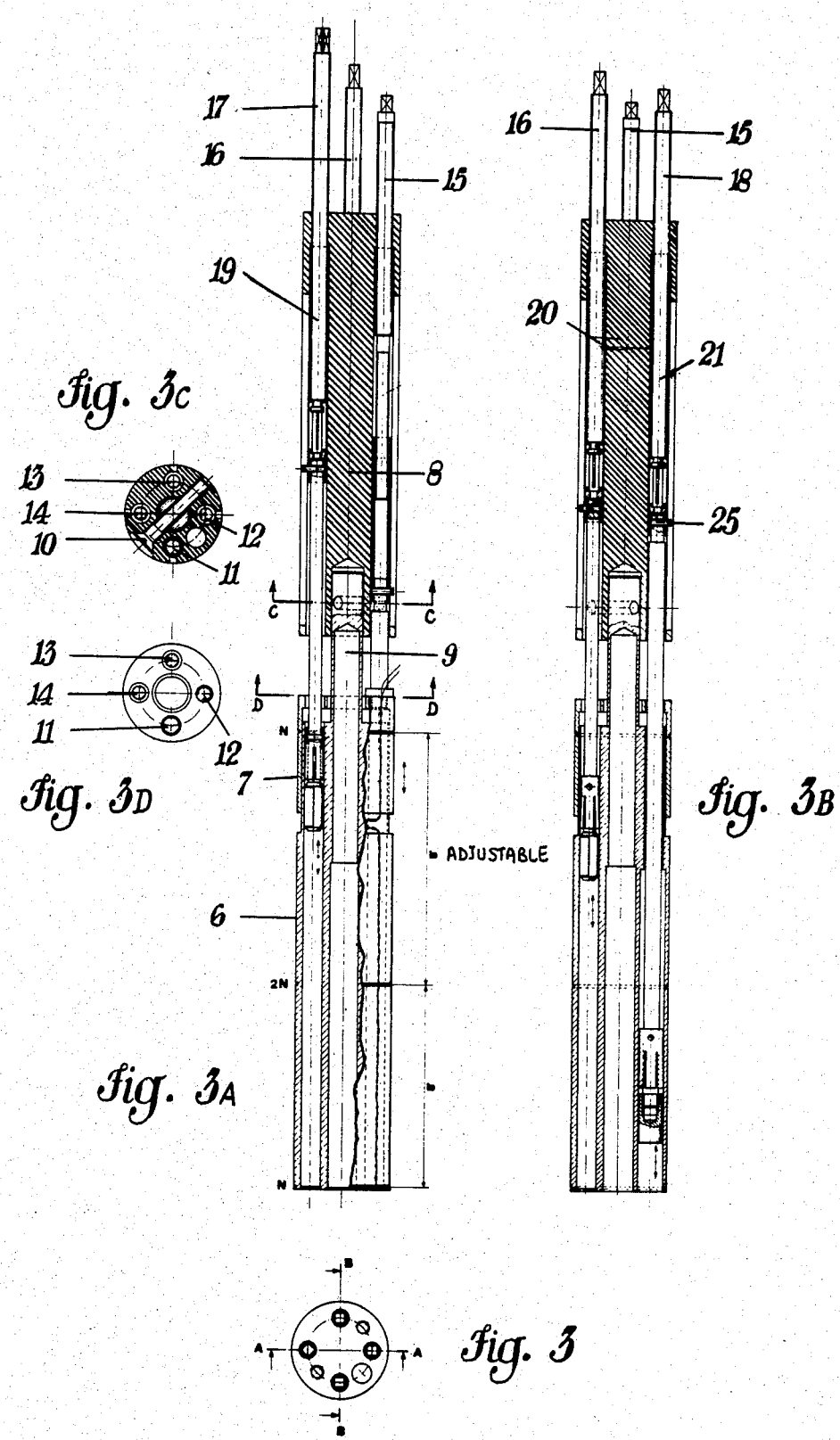
FIG. 3 is a plan view of a gradiometer provided with a device according to the invention.
Figure 4:
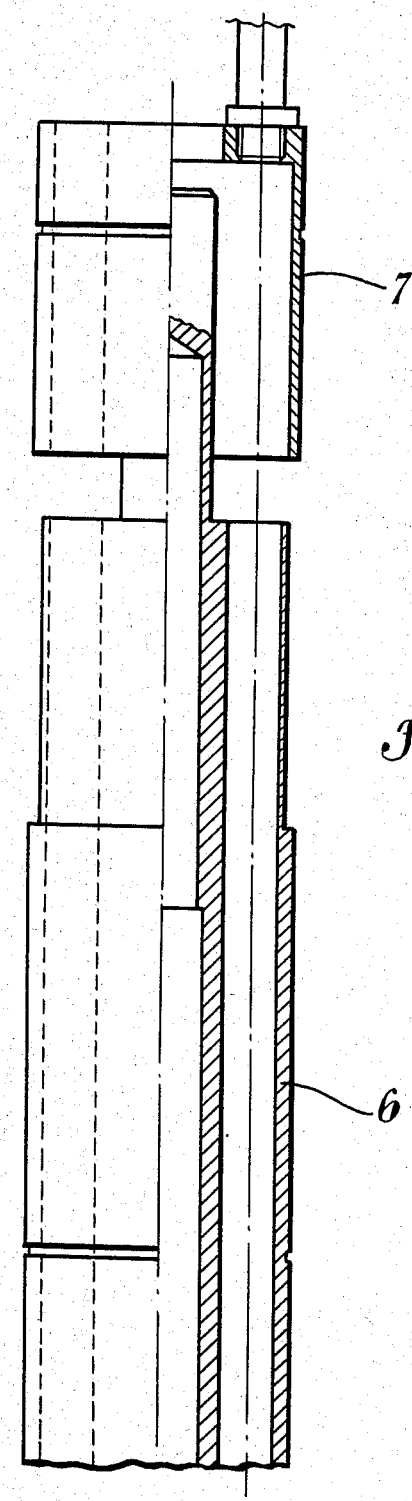
FIG. 4 is a detail view of the two elements forming the support member of the coils.

A representation of the invention is shown in FIGS. 3 to 3D, comprising a series of detailed views showing both the gradiometer itself and the fine balancing mechanism according to the invention.

The support member of the three coils is formed by elements 6 and 7, while the support block of the balancing controls is designated 8. Element 6 has an upper extension 9 and it is connected with 8 by means of a pin 10. Elements 6, 7 and 8 have four holes 11, 12, 13 and 14, aligned up in the three elements, for extension of control bars 15, 16, 17 and 18, therethrough. Bars 16, 17 and 18, by which the balancing of the axes x, y and z is controlled, consist of four segments; the upper segment is engaged in the square key 22 (FIGS. 6 and 7) and exits at the top of the cryostat in order to facilitate manual control; such upper segment is not shown in FIGS. 3 to 3D, but is only shown schematically in FIG. 1. The second element, which is identical for the three bars (23 in FIGS. 6 and 7), is screw threaded, fits into threading 19,20,21 and translates the up-down motion into a rotary motion imparted from outside. The third element (24 in FIGS. 6 and 7), which is also identical for the three bars, is a cylindrical body split up to ¾ of its length, which is latched to element 23 by means of a groove which permits free rotation. A pin 25 keeps this element blocked to terminal portion 26 (or 27) and extends into a slot of element 8 so as to prevent rotary motion and to enable up-down motion. The last element, designated 26 in FIGS. 6 and 7 is identical for bars 16 and 17 which are intended for the balancing of axes x and y. It is a rod having its lower end portion vertically milled to such an extent as to leave only a half-cylinder 12 mm in height, to the planar face of which a rectangular plate of lead is glued.

As for bar 18, which is intended for the balancing of axis z, the fourth element differentiates only in the end portion which is not milled and bears the circular lead plate glued to the bottom portion. A spring member 28, obtained from a cylinder cut in order to present vertical elastic members, is added to the three bars in order to prevent the oscillating motion of each bar in the hole of block 6.

Figure 5:
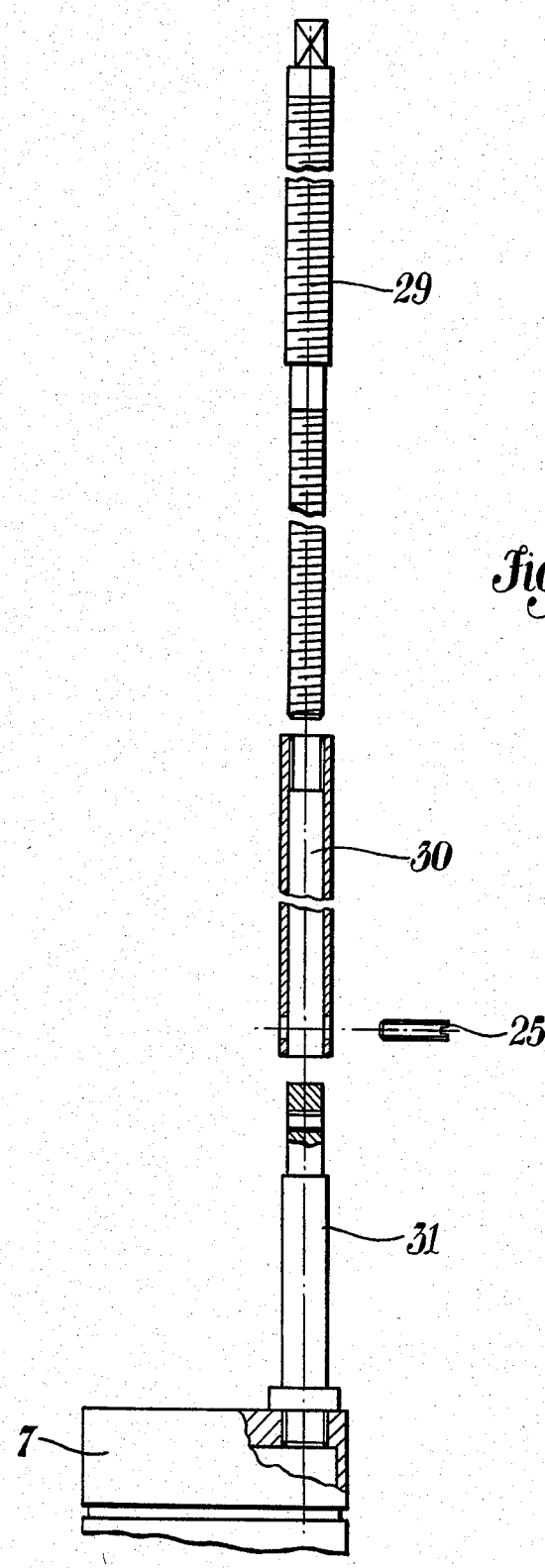
FIG. 5 is a detail view of the bar to control the displacement of the upper coil.

Bar 15 operates to adjust the distance of the upper coil from the central coil. It is shown in FIG. 5. Element 29, which is similar to elements 23, is provided with double screw threads, the upper of which is engaged with element 8, while the lower is engaged with element 30 which is prevented from rotating by pin 25. This pin also operates to connect the cylindrical seat 30 with rod 31 threadedly engaged with and glued to element 7. By rotating the upper bar, the support element 7 can be vertically displaced with respect to element 6 with a speed (per revolution) that is determined by the pitch difference of the screw threads of element 29, thereby enabling a finer adjustment to be achieved than that of the other three bars.

The significant improvement obtained by means of this additional balancing systenm is evidenced by the noise spectrum recorded at the magnetometer output, which is the most reliable parameter to evaluate the balancing level of the gradiometer, the other conditions being the same.

FIG. 8 shows the two noise spectra measured at the magnetometer output, before and after use of the system described hereinabove.

The displacement of the initial point of the noise 1/f from about 10 Hz to 0.4 Hz is very important to the biomagnetism measurements. The performance of the disclosed instrumentation is presently the best performance that can be obtained anywhere in the world in any instrumentation wherein 2nd derivative gradiometers are utilized. The disclosed invention therefore is extremely useful in measurement equipments for clinical purposes. Since the apparatuses for biomagnetic measurements, wherein 2nd derivative gradiometers provided with a balancing system only for the constant field are used, presently are commercially manufactured, it is expected that the possibility to improve the performance of such apparatus, as evidenced by this invention, will presumably be of great industrial interest.

The equipment presently is used to measure sources of magnetic signals of biological type, and the embodiment of the herein disclosed invention brings about a noticeable improvement in the performance in the frequency range of interest.

The instrument can also be used to measure any sources of weak magnetic signals at short distances.

Since, to date, 2nd derivative gradiometers have been manufactured upon a single rigid support member, the essence of this invention consists in the fact that a coil, e.g., the central coil, is made movable with respect to the other coils.

What is claimed is:

1. A fine balancing 2nd derivative gradiometer with three coils including an upper coil and a lower coil each having N turns, and a central coil having 2N turns and being wound inversely to said upper and lower coils, comprising a support member for said coils consisting of two coaxial elements, the first of said elements bearing said central coil and said lower coil, and the second element bearing said upper coil as well as adjusting means for controlling a micrometric variation of the distance between said upper coil and said central coil by movement of said second element in order to achieve the desired fine balancing.

2. A gradiometer according to claim 1, wherein said micrometric movement means comprise a rod having an upper screw portion and a lower screw portion threaded with different pitches, said rod being connected with a reciprocally movable element rigidly connected with a support element so as to translate the rotary motion of the upper rod portion into a micrometric vertical sliding motion, determined by the pitch difference between said screw threaded portions.

3. A gradiometer according to claim 2, wherein said differentially threaded rod operates upon the support element of said upper coil so as to vary the distance of its plane with respect to said central coil.

* * * * *